(12) United States Patent
Christophersen et al.

(10) Patent No.: US 8,372,578 B2
(45) Date of Patent: Feb. 12, 2013

(54) GRAY-TONE LITHOGRAPHY USING OPTICAL DIFFUSERS

(75) Inventors: Marc Christophersen, Alexandria, VA (US); Bernard Phlips, Great Falls, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 998 days.

(21) Appl. No.: 12/195,594

(22) Filed: Aug. 21, 2008

(65) Prior Publication Data

US 2009/0092934 A1    Apr. 9, 2009

Related U.S. Application Data

(60) Provisional application No. 60/978,514, filed on Oct. 9, 2007.

(51) Int. Cl.
G03F 7/20 (2006.01)
(52) U.S. Cl. .................................. 430/325; 430/321
(58) Field of Classification Search .................. None
See application file for complete search history.

(56) References Cited

U.S. PATENT DOCUMENTS

| 5,298,366 | A | | 3/1994 | Iwasaki et al. |
| 5,310,623 | A | | 5/1994 | Gal |
| 5,830,605 | A | * | 11/1998 | Umeki et al. ............ 430/5 |
| 6,016,185 | A | | 1/2000 | Cullman et al. |
| 6,498,685 | B1 | | 12/2002 | Johnson |
| 6,897,911 | B2 | * | 5/2005 | Yamaguchi ............ 349/57 |
| 7,364,838 | B2 | | 4/2008 | Lizotte |
| 2003/0101421 | A1 | * | 5/2003 | Satoh ............ 716/1 |
| 2004/0146807 | A1 | * | 7/2004 | Lee et al. ............ 430/311 |
| 2005/0053844 | A1 | | 3/2005 | Wu |
| 2006/0061708 | A1 | * | 3/2006 | Umebayashi et al. ...... 349/95 |
| 2007/0268585 | A1 | * | 11/2007 | Santoro et al. ............ 359/599 |
| 2009/0294888 | A1 | * | 12/2009 | Tsai et al. ............ 257/435 |

FOREIGN PATENT DOCUMENTS

WO    2005/078523    *    8/2005

OTHER PUBLICATIONS

Chang et al., "Shape controlled, high fill factor microlens arrays fabricated by a 3d diffuser lithography and plastic replication method", Opt. Exp. vol. 12(25) pp. 6366-6371 (Dec. 2004).*
Jay et al., "Preshaping photoresist for refractive microlens fabrication", Opt. Eng. vol. 33(11) pp. 3552-3555 (Nov. 1994).*
Dong et al., "Mask shift filtering for forming microstructures with irregular profile", Appl. Phys. Lett., vol. 89 pp. 261105-1 to 261105-3 (Dec. 2006).*
Du et al., "Methods and experimental study for diffraction/refractive micro-optical elements with continuous profile", Proc. SPIE vol. 4924 pp. 61-68 (2002).*
Edmund Industrial optics, "1999 optics and optical instruments catalog", cover and pp. 52-53 (1999).*
PCT Search Report and Written Opinion, (Dec. 2008).
Christophersen et al., "Gray-tone lithography using an optical diffuser and a contact aligner" Appl. Phys. Lett., 92, 194102 (2008).

(Continued)

Primary Examiner — Martin Angebranndt
(74) Attorney, Agent, or Firm — Amy L. Ressing; Joseph T. Grunkemeyer

(57) ABSTRACT

A method of: directing an exposing light through an optical diffuser; directing the diffused light though a photomask having transparent areas corresponding to a gray-tone pattern; directing the masked light onto a photoresist material on a substrate; developing the photoresist to produce a three dimensional structure in the photoresist.

16 Claims, 14 Drawing Sheets

OTHER PUBLICATIONS

Cohn et al., "Fully complex diffractive optics by means of patterned diffuser arrays: encoding concept and implications for fabrication" J. Opt. Soc. Am. A, 14(5), 1110-(1997).

Hanai et al., Micromachining and Microfabrication Process Technology IX. Proceedings of the SPIE, 5342, 221-228 (2004).

Lee et al., "A simple and effective lift-off with positive photoresist" J. Micromech. Microeng., 15, 2136-2140 (2005).

Sales et al., "Engineered diffusersO for display and illumination systems: Design, fabrication, and applications" Photonics Spectra, 38, 58-60 (2004).

* cited by examiner a)

b)

GRAY-TONE LITHOGRAPHY USING OPTICAL DIFFUSERS

This application claims the benefit of U.S. Provisional Patent Application No. 60/978,514, filed on Oct. 9, 2007. This application and all other publications and patent documents referenced throughout this application are incorporated herein by reference.

TECHNICAL FIELD

The subject matter is generally related to gray-tone lithography.

DESCRIPTION OF RELATED ART

The general method used to define features on a wafer is termed "photolithography." The enabling material of photolithography is a polymeric optically-sensitive material called "photoresist." Resist films can be deposited onto a silicon wafer through a spin-coating process. A standard optical photo-mask with clear and opaque patterns is then used to selectively transmit incident UV light, exposing only those areas of photoresist unprotected by an opaque section of the mask. This is mainly a black and white exposure leading to binary features. Exposure to, for example, UV light will change the chemistry of the photoresist, making it either more or less soluble in a developer solution. The photoresist is then baked in a convection oven or on a hot plate at low temperature (~100-200° C.) to remove solvent. A UV exposure breaks or forms chemical bonds within the photoresist and makes exposed areas more or less soluble. Upon immersion in a developing solution, soluble regions will be washed away and a spatially selective pattern is formed in the photoresist, exposing certain regions of the wafer to further processing. The bulk of the semiconductor industry is based on this "black-and-white" technology.

The fabrication of 3-D microstructures with well-defined curved surface contours is of great importance for various mechanical, optical and electronic devices. Complex geometrical structures or topographies are necessary to obtain a certain mechanical stability, a specific surface property or a predetermined electrostatic field configuration. Gray-tone lithography (also known as gray-scale lithography) is a specialized lithography process which results in continuously variable resist profiles. A gray-tone optical mask is used to transmit only a portion of the incident intensity of light, partially exposing sections of a positive photoresist to a certain depth. This exposure renders the top portion of the photoresist layer more soluble in a developer solution, while the bottom portion of the photoresist layer remains unchanged. Traditionally, there are two primary techniques to fabricate gray-tone masks. The first one directly employs a high-energy electron or laser beam to write patterns with different intensities onto a glass plate sensitive to this beam (Wu, US Patent Application Publication 2005/0053844). Although smooth resist surfaces can be obtained when performing exposure by this mask, however, the mask cost is high. The second method generates binary pattern arrays with sub-micrometer resolution on standard chrome-on-glass masks, which create the desired gray-tone effect (Gal, U.S. Pat. No. 5,310,623; Henke et al., *Microelectronic Eng.*, 27, 267-270 (1995)). The pattern of the mask needs to be effectively reduced in size when exposing the photoresist. This reduction is required since the gray tone resolution elements are binary; they need to be blurred so that the gray tone resolution elements no longer appear as distinct binary features. There are three ways to encode the three dimensional the profile:
1. sub-resolution openings with width modulations
2. sub-resolution openings with density modulations
3. combination of coding techniques a and b Currently, gray-tone masks are commonly used with lithography steppers. Normally steppers reduce the mask-features by a factor of 4×, 5×, or 10×, which helps to blur the light intensity. Stepper exposures are expensive in comparison to traditional contact lithography (Waits et al., *J. Micromech. Microeng.*, 13, 170-177 (2003)). Stepper systems are primarily used in the IC industry, while contact lithography is often used in MEMS fabrication because it can produce most required dimensions at lower costs.

Several approaches to circumvent a costly stepper exposure have been published. A contact aligner has been deliberately defocused in order to blur the mask features (Hanai et al., *Micromachining and Microfabrication Process Technology IX. Proceedings of the SPIE*, 5342, 221-228 (2004)). A transparency mask has been used with different transmittances (negative Kodak high-resolution film plate) to develop gray-tone resists (Nicolas et al., *J. Micromech. Microeng.*, 8, 95-98 (1998)). The so called "MEMSNAS process" has been developed, which is a single exposure step from a contact aligner which is followed by two sequential RIE etching steps (Bourounina et al., *J. Microelectromech. Syst.*, 13, 190-199 (2004)). The range of three-dimensional shapes that may be made with this method of limited.

An optical diffuser has been used to obtain the specific shape of bowl shaped structures in resist (Lee et al., *J Micromech. Microeng.*, 15, 2136-2140 (2005)). The potential of an optical diffuser to generate gray-tone lithography was not disclosed. The opposite technique of using thickness modified resists to fabricate optical micro-lenses arrays and diffusers has been demonstrated (Cohn et al., *J. Opt. Soc. Am. A*, 14, 1110-1123 (1997)). An optical diffuser has been placed between a gray-tone mask and a photoresist (Lizotte, US Patent Application Publication 2005/0260508).

BRIEF SUMMARY

Disclosed herein is a method comprising: directing an exposing light through an optical diffuser to produce diffused light; directing the diffused light though a photomask having transparent areas corresponding to a gray-tone pattern to produce masked light; directing the masked light onto a photoresist material on a substrate; developing the photoresist to produce a three dimensional structure in the photoresist.

BRIEF DESCRIPTION OF THE DRAWINGS

A more complete appreciation of the claimed subject matter will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed herein is a potentially simplified and more cost-effective way to produce uniform, controllable three-dimensional photo-resist patterns with continuously variable depth. The use of variable depth photo-resists is known in the field as gray-tone lithography. The collimated light from a contact lithography aligner is randomized using an optical diffuser to generate uniform, controllable intensity distributions in the photoresist. This technique can supplement or eliminate the need for a stepper exposure or the need for a HEBS (High Energy Beam Sensitive) glass mask. These contact lithography aligners are widespread in microelectronics laboratories and industry. Depending on the application, this pattern is either the final structure or is used as a mask or a mold that is transferred into the appropriate material.

Gray-tone lithography is often used in conjunction with Reactive Ion Etching (RIE) or Deep Reactive Ion Etching (DRIE). This combination is often called "gray-tone" technology. After etching, the remaining substrate thickness depends on the original thickness of the photo-resist. The masking material will be simultaneously etched along with the substrate. However, the etch rate of standard photo-resist masking material is usually many times lower than the etch rate of silicon.

Gray-tone lithography is of great interest for micro-optical, -fluidic and -electromechanical devices. It is the key technology for these 3-D fabrication processes because the profile of the UV dose decides the surface profile of the device, which directly affects the shape of the component and therefore their final functionality.

Recent technological advances in micro-fabrication techniques have made it possible to use 3-D MEMS (microelectromechanical systems), micro-optical device, and other micro-structures in various fields of interest, including photonics and integrated circuits. One way to fabricate such structures is laser micro-machining, which is a time consuming and therefore costly method compare to gray-tone lithography.

Figure 1:
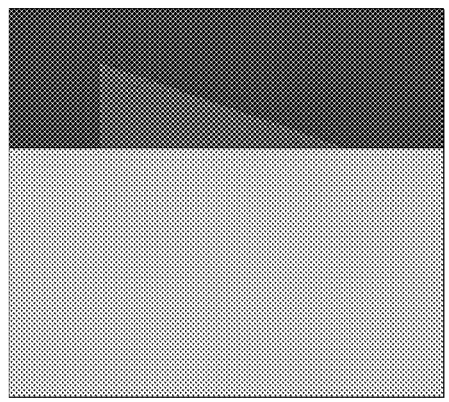
FIG. 1 shows a schematic of 3D molding using a gray-tone lithography: a) resist profile, b) molded replica.
Figure 1:
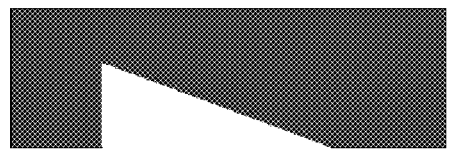
Figure 2:
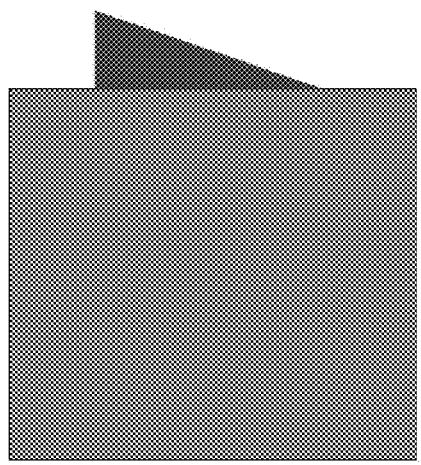
FIG. 2 shows a schematic of 3D silicon profile after DRIE or RIE etching: a) resist profile, b) silicon profile after etching (schematics not to scale).
Figure 2:
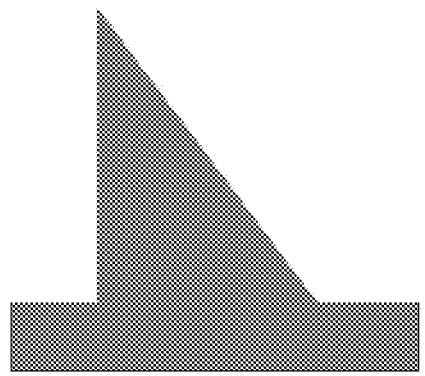

In principle there are two methods to obtain a 3D micro-device from gray-tone lithography. The first is to fabricate a replica by molding a second material on top of the resist (FIG. 1). For example micro-fluidic devices are often based on PDMS (polydimethylsiloxane), a widely used silicon-based organic polymer, as a mold. The second method is based on a reactive ion (RIE) or deep reactive ion (DRIE) process that can be used to transfer the resist into a 3D silicon or other material profile (FIG. 2). During the DRIE and RIE process, the masking material will be simultaneously etched along with the substrate. However, the etch rate of the masking material, such as photoresist, may be many times lower than the etch rate of silicon. This ratio of the silicon to photoresist etch rates is referred to as the "etch selectivity." In gray-tone technology, the etch selectivity becomes an important parameter to control because the difference in the etch rates of the two materials causes an amplification of all vertical dimensions, as indicted in FIG. 2. This amplification of by the vertical dimensions can be used to fabricate 3D structures several hundred micrometers tall.

The general operation of the method can follow a standard lithography sequence: resist spinning, soft-bake step, exposure using a photo-mask, resist development, and an optional hard-bake. During exposure an optical diffuser is placed on top of the photo-mask underneath the light source from the aligner. The general operation sequence may be unchanged, which can allow for an easy implementation of the method. By placing the diffuser in the optical path before the mask, there is more freedom in the ability to tune the amount of blurring.

Figure 3:
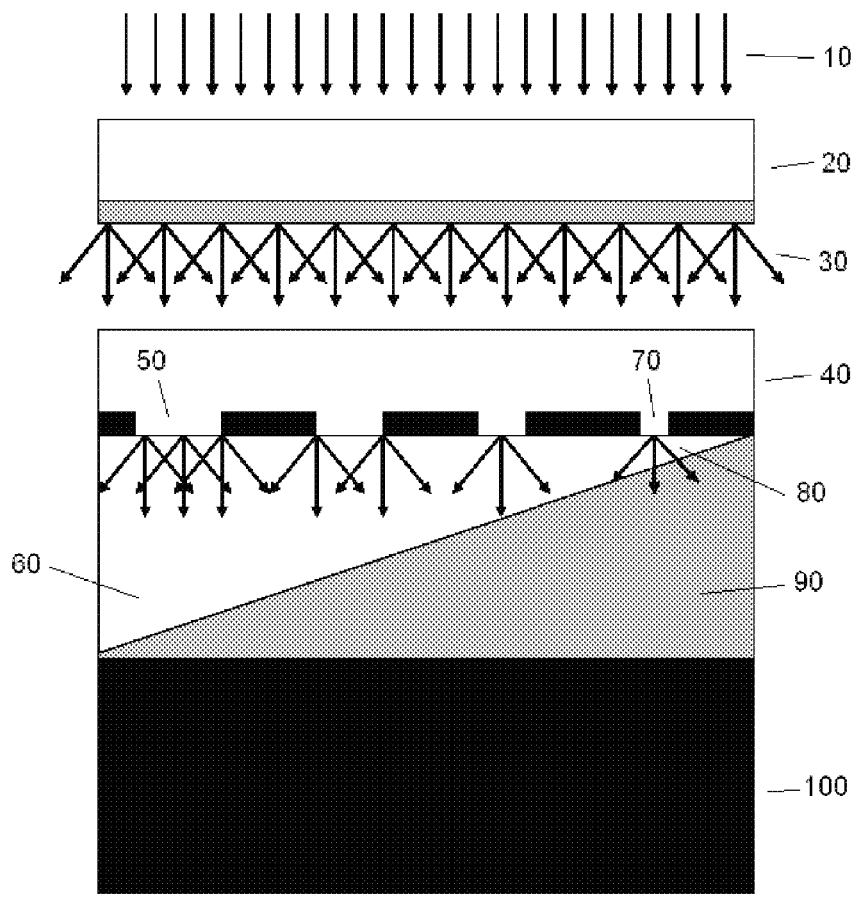
FIG. 3 shows a schematic of an exposure setup.

FIG. 3 shows a schematic of an embodiment of the exposure setup. The exposing light 10 passes through diffuser 20, producing diffused light 30. The diffused light 30 then passes through the photomask 40. Thus, the mask is between the diffuser and the photoresist. The larger open areas of the mask 50 create a deeper exposed region of the photoresist 60. The smaller open areas of the mask 70 create a thinner exposed region of the photoresist 80. Unexposed photoresist 90 is under the exposed regions. The photoresist is on top of the substrate 100.

The source of the exposure light can be any light that is suitable for exposing the photoresist. Such light sources are known in the art. The light may be collimated. For a suitable photoresist, a UV light source may be used.

A variety of optical diffusers may be used, including Lambertian and non-Lambertian. A Lambertian diffuser creates an approximately even distribution of light in all direction. Different types of optical diffusers can be used to optimize the resulting resist profiles by controlling the diffusing angles and distribution of energy for gray-tone lithography. Commonly used diffuser technologies include ground glass, opal glass, holographic diffusers, and diffractive diffusers. Ground and opal glass scatter light equally in all directions and offer limited light-control capabilities. Holographic, or "engineered" diffusers, have the ability to spread light with specified divergence angles, control the spatial distribution of light, and control the intensity profile of the diffused light. An optical diffuser will help to randomize the light in combination with a standard gray-tone mask which is comprised of sub-resolution mask features.

Diffusers are commonly used to spread and homogenize otherwise non-uniform light sources. The optical theory for projection imaging in combination with diffuser is well developed (Schertler et al., "Uniform Scattering Patterns from Grating-Diffuser Cascades for Display Applications", *Appl. Optics*, 38, 291-303 (1999)). Diffusers find common use in the spread and homogenization of otherwise non-uniform illumination. The homogenization capability of any diffuser is related to the random distribution of its scattering centers, which constitute the features responsible for directing light into the various directions within the spread of the diffuser. Common surface diffusers such as ground glass and holographic diffusers scatter light with a Gaussian intensity profile. Another type of a common diffuser is opal glass. Opal glass is comprised of randomly distributed micro cavities in a matrix material. Opal based diffusers exhibit Lambertian scatter profiles.

Figure 4:
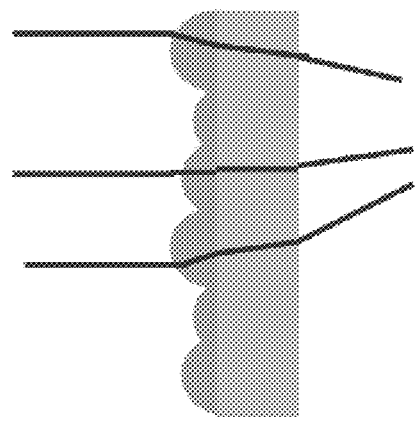
FIG. 4 shows a schematic of an engineered diffuser.

A new generation of diffusers is comprised of an array of micro-lenses. (These diffusers were developed by RPC Photonic and are sold under the trademark Engineered Diffusers™). The surfaces of these diffusers have scatter centers, which are similar to micro-lenses (FIG. 4). These diffusers can enable control not only of diffusing angles but also the distribution of energy with high efficiency. These diffusers can be made by exposing a photo-resist with a modulated laser-writer on a point-by-point basis. The resulting 3-D resists are then utilized in a replication process to transfer the resist pattern into an optical polymer, the final diffuser. Furthermore, standard gray-tone lithography in combination with RIE and ion milling has been used to fabricate IR diffusers in germanium (Sales et al., "Engineered Diffusers™ for display and illumination systems: Design, fabrication, and applications", *Photonics Spectra*, 38, 58-60 (2004)).

For an engineered diffuser, the basic scattering unit is normally, though not always, a microlens element. The overall performance of the diffuser is determined by the whole microlens array. The design prescription of each lens varies across the array depending on the required properties and divergence angles. By tailoring the surface profile of each microlens unit and the overall distribution of microlenses in the array it is possible to control the resulting diffuser pattern. The resulting scattering profile can be calculated for a given microlens arrays by ray-tracing (FIG. 4 schematically shows some rays). The resulting scattered light of these diffusers can have almost any energy vs. angle distribution. For example, a linear relationship allows for easier gray-tone lithography mask design. Two or more layers of microlenses in the diffuser are also possible.

The photomask may be any type of photomask used in gray-tone lithography, including but not limited to, those described above such as a high energy beam sensitive glass mask or a laser patterned photomask. The mask may be generated with various sizes and spacings on an opaque background. To first order, the resulting image in the resist can be treated as convolution of the mask features with the blurred light from the diffuser. The optical theory for projection imaging in combination with a diffuser is well developed (Cohn et al., *J. Opt. Soc. Am. A*, 14, 1110 (1997); Sales et al., *Photonics Spectra*, 38, 58 (2004)). The photomask may be positioned to be in contact with or to leave a gap between the photomask and the diffuser and/or the photoresist. The size of the gap may be used to tune the amount of blurring or smearing of the light.

The photoresist may be any photoresist suitable for use with the exposing light. Such photoresists are known in the art. It may be a positive or a negative photoresist. If the photoresist is negative, areas exposed to light become crosslinked, and insoluble in the developer solution, while the unexposed regions remain soluble. The thickness of the resist can be changed, for example, from a few to several hundred micrometers. The thickness influences the light path and the degree of light randomization.

Figure 5:
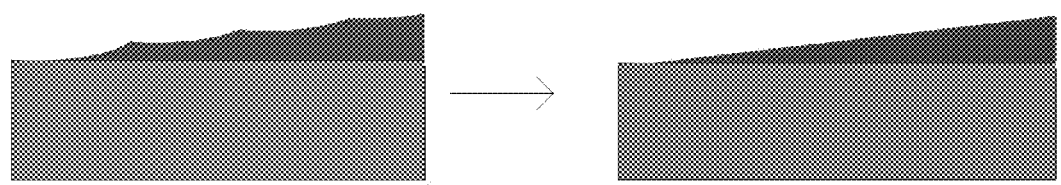
FIG. 5 schematically shows the smoothing effect of a hard bake.

After exposing the photoresist, a number of other acts may be performed. The exposed photoresist may be developed, according to methods appropriate to the photoresist used, to produce a three dimensional structure in the photoresist. After developing, a hard bake may be performed by heating the three dimensional structure in the photoresist under conditions effective to cause smoothing of the resist profile. For example, a bake at 110° C. for 2-40 min can smooth the resist profile. This may also round any sharp edges in the resist (FIG. 5). The temperature and time can be used to influence the resist profile. The usefulness of the hard bake depends at least partially on the application.

The developed photoresist may be processed, for example by etching, to reproduce a scaled version of the three dimensional structure on the substrate (FIG. 2). As the etch proceeds, the photoresist mask slowly erodes, exposing the underlying silicon to the high etch rate plasma. Thus, gray-tone technology relies on specifically developed DRIE recipes to control the relative etch rate of silicon to photoresist, called "etch selectivity," to define the final vertical dimensions of a 3D structure in silicon. It is possible that the scaled version is 1:1 scale or a higher or lower scale. Three dimensional structures in substrates have uses that are known in the art, including but not limited to, microelectromechanical systems.

Instead of etching the photoresist (or before any etching), a mold may be formed from the three dimensional structure in the photoresist (FIG. 1).

Figure 6:
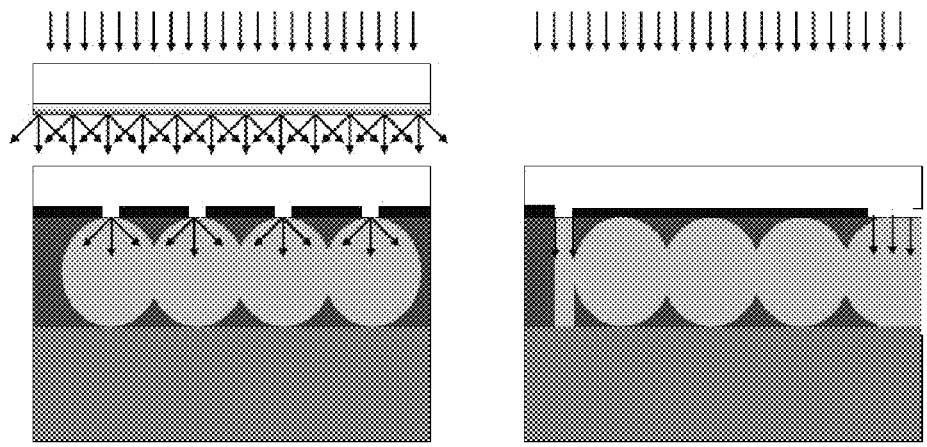
FIG. 6 shows a two step exposure with a standard mask in order to generate sharp edges.

With a diffuser all sharp corner or edges may be smeared out. This may be useful for round features like in microlenses. A second exposure with a standard mask may allow the formation of sharp edges (FIG. 6), in order to have vertical resist structures. The exposing light (non-diffused) is directed through the second mask to produce non-diffused masked light, which is then directed onto the photoresist material. Another option is a second exposure which uses again a diffuser with a shifted mask in order to get a smoother resist profile. Also, an optical diffuser can be combined with blurring (Hanai et al., *Micromachining and Microfabrication Process Technology IX. Proceedings of the SPIE*, 5342, 221-228 (2004)). The diffuser and the defocusing will generate blurred light patterns for gray-tone lithography. The method may also optionally be combined with prior gray-tone lithographic methods such as directing the masked light through a lithography stepper or defocusing the masked light.

The fact that lithography-steppers are needed has hampered the use of gray-tone lithography for regular MEMS. The disclosed method allows the micro-fabrication of complex 3D silicon structures with a standard masks and contact aligners. Standard masks (critical dimension>2 µm) can be produced much more cost-effectively than stepper masks.

A potential advantage of the method is that no additional steps before, during, or after UV exposure are necessary to obtain gray-tone resist profiles. The only difference from common contact aligner exposure is that the diffuser is placed on top of the mask. The straightforwardness of the method distinguishes it from other gray-tone methods using a contact aligner. For example, the MEMSNAS process requires two sequentially RIE etch steps; whereas the present gray-tone resist is directly transferable into silicon profiles. The techniques of Hanai et al. and Nicolas et al. represent a single exposure step with a contact aligner. Hanai's blurring technique due to defocusing lacks a good control of the light intensity at the resist. Nicolas' transparency masks lack good light transmission properties. Small feature sizes (<5 µm) or thick resist (>5 µm) can normally not be successfully exposed with a transparency mask.

The following examples are given to illustrate specific applications. These specific examples are not intended to limit the scope of the disclosure in this application.

EXAMPLES

Figure 7:
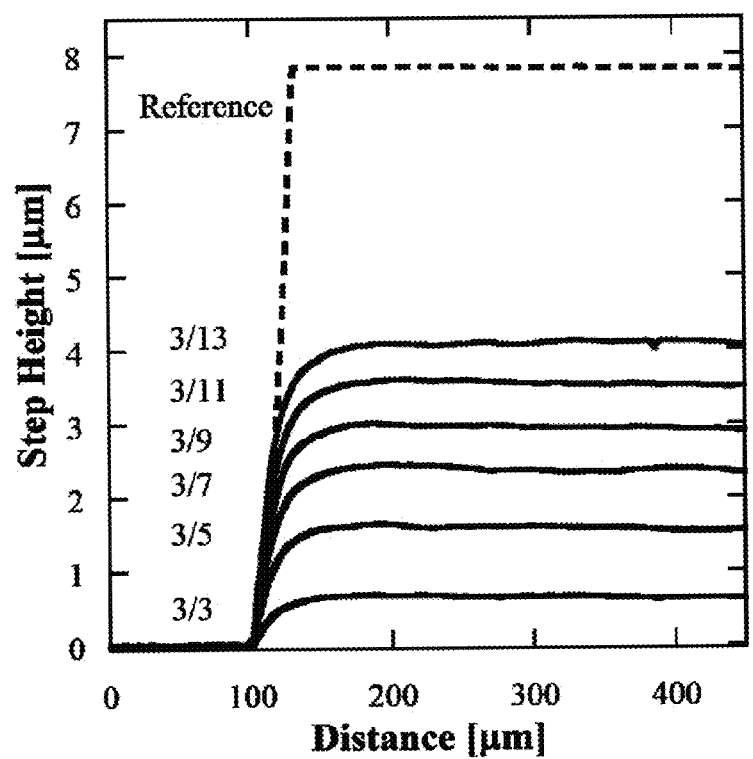
FIG. 7 shows an example of a calibration curve, resist heights generate by strips with different gaps (3 μm strip width and variable gaps (μm)). The reference is the full resist step height. In the figure, the feature edges are coaligned at a distance of 100 μm.

The masks were written using a HEIDELBERG DWL99 laser pattern generator (smallest dimension>2 µm). In order to ensure that the final 3-D structures after exposure and development are precisely as designed, a generic calibration mask was fabricated to experimentally investigate the resulting "gray levels." Hole and strip arrays ranging from 2.5-48 µm were patterned on the chromium photo-mask. An opaque open area on the mask was included adjacent to the highest gray level as a reference point, so the heights of gray levels after fabrication can be measured and correlated to the pixel size that created them. In hard-contact mode, a suitable range for the mask elements is 2 to 15 µm, allowing devices larger than 20 µm. (Using a deliberate de-focus of the mask, the maximal mask element size can be increased.) An opal diffuser was used. FIG. 7 shows one calibration curve for e.g. 3 µm wide strips with different gaps. The calibration masks were later used to determine the thickness of the resist as a function of the open fraction in the mask.

Figure 8:
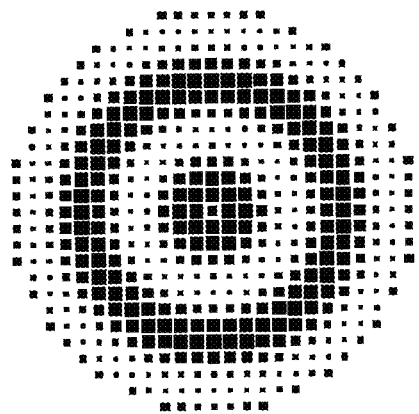
FIG. 8 shows an example gray-tone mask.

The general shape of one of the mask features is shown in FIG. 8. Based on the calibration data, an in-house generated MATLAB® code produced more sophisticated 3-D profiles, e.g. sinusoidal variation of dots. The images generated were exported and transferred into the photo-mask. The photo-mask consisted of squares with 2-14 µm width with a linear and sinusoidal density gradient.

Novolak resist (AZ P4330 Clariant, 3-10 µm thick) was spin-coated onto <100> test grade silicon wafers using standard procedures for this photoresist. In some cases, priming in hexamethyldisilizane (HMDS) was performed to improve the adhesion. According to standard soft-bake procedure, the wafer was heated to 110° C. for 90 s on a hotplate in order to drive solvents out of the resist prior to UV exposure. The photolithography recipe used for 8 µm thick AZ P4330 is shown in Table 1.

TABLE 1

| Dehydration | |
|---|---|
| hotplate | >130° C., >10 min |
| Adhesion Promoter | |
| HMDS | |
| cover wafer | wait 60 s |
| spin | 3,000 rpm, 30 s |
| Photoresist | |
| AZ P4330 | 10 µm thick |
| spin | 1,000 rpm, 30 s (ACC 150 rpm/sec) |
| solvent evaporation | wait 60 s |
| soft bake | hotplate, 110° C., 110 s |
| exposure dose | 720 mJ/cm² (with optical diffuser) |
| develop | AZ400K:DI water 1:4, 180 s |
| hard bake | (optional) 110° C., 2-40 min |

Figure 9:
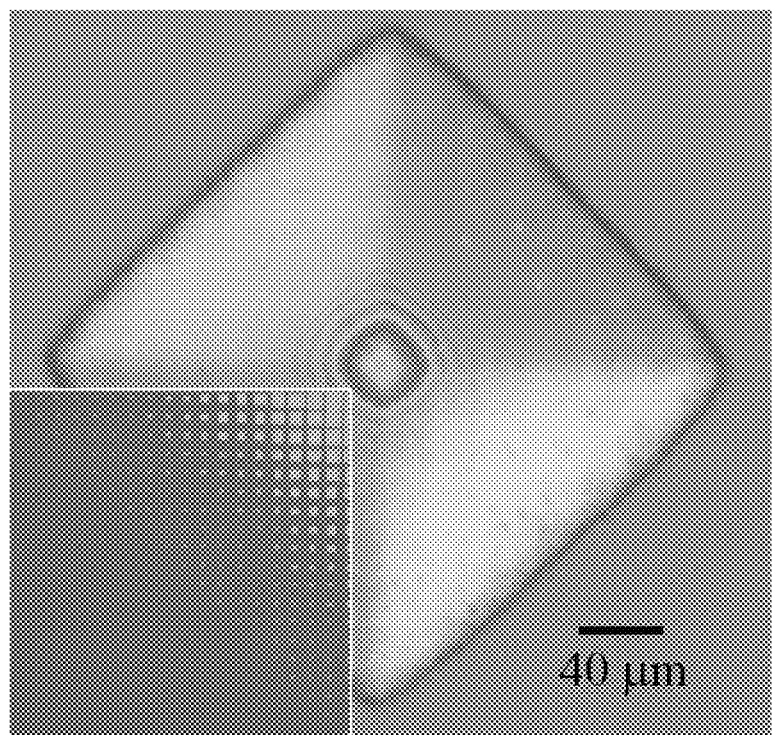
FIG. 9 shows an optical micrograph (top) of an inverted pyramid and a profilometer scan (bottom) of the side wall of the pyramid. The inset in the micrograph is part of the mask that generated the pyramid.
Figure 9:
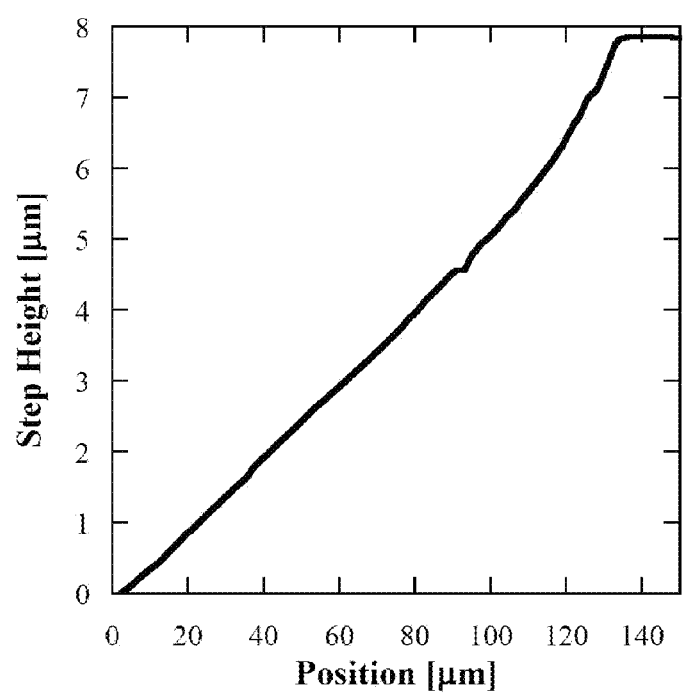
Figure 10:
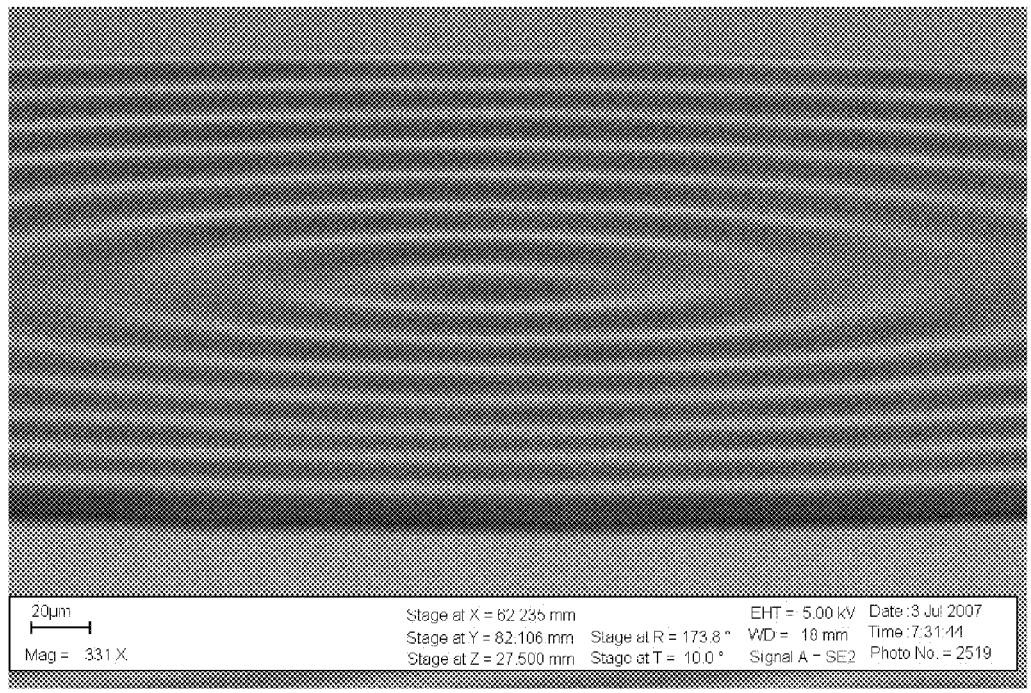
FIG. 10 shows an SEM micrograph (top) and profilometer scan (bottom) of the sinusoidal pattern produced using the pattern shown in FIG. 8.
Figure 10:
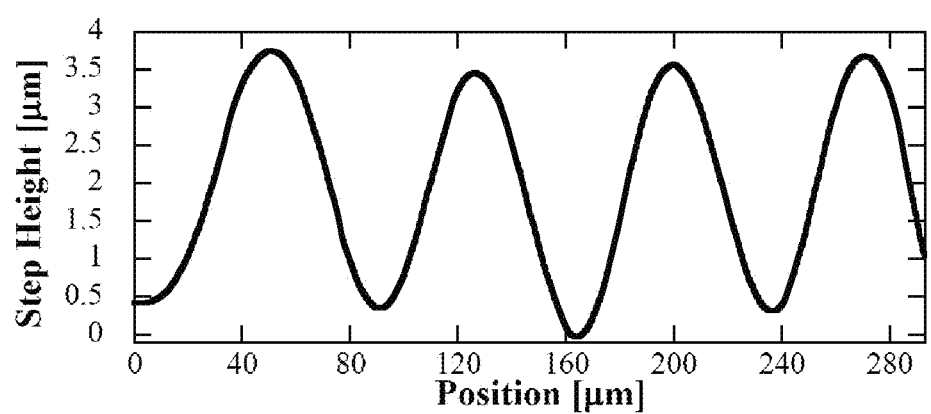

The resist was UV-exposed using a common Karl Suss MJB-3 or ABM contact aligner. The diffuser was placed on top of the photo-mask. The exposure dose (deposited energy by UV light on resist) needed to optimized for each diffuser due to different UV transmittance. For example, a dose of 720 mJ/cm² was used for a 10 µm thick AZ P4330 resist using an Engineered Diffuser™ (RPC Photonics). The dose used for 4 µm thick AZ P4330 with an Edmund Optics NT02-149 opal diffusing glass was 900 mJ/cm². According to standard development procedure, the resist was developed using the puddle method. 1:3 DI water:400K AZ developer was used for 3 min which was followed by a sound DI water rise. Some resulting resist profiles are shown in FIGS. 9 and 10. In FIG. 9, the profilometer scan shows high linearity. (The accuracy of the profilometer is 0.5 µm horizontal and 2.5 nm vertically.) In FIG. 10, the quantitative agreement between the profilometer scan and an ideal sine wave shows the accuracy of the method.

Figure 11:
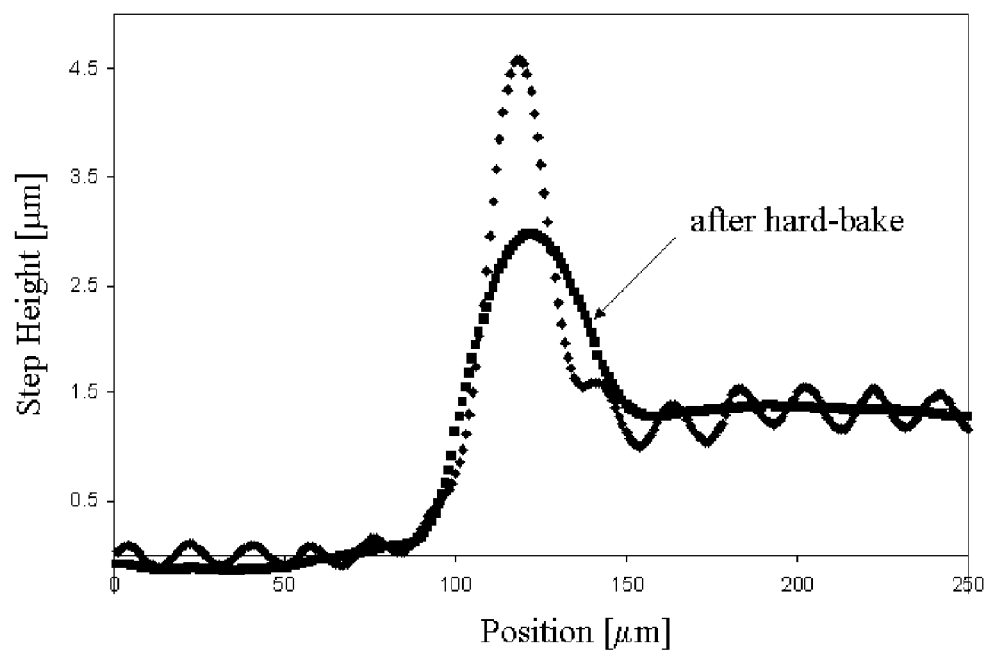
FIG. 11 shows the effect of a hard-bake step.

A hard-bake bake at 110° C. for 2-40 min smoothened the resist profile. FIG. 11 shows the profilometer scans from a resist before and after hard bake (40 min at 110° C.). The resist shows roughness before the hard bake generated by the array of lines in the mask. The volume of the hillocks is roughly the same as the valleys, which is ideal for smoothing during reflow. A hard bake will also round any sharp edges in the resist. Depending on the applications this might or might not be desired. All photo-resist masking layers were hard-baked to avoid reticulation during the etching process. Furthermore, the hard-bake helped to smooth out the transition between the gray levels.

Figure 12:
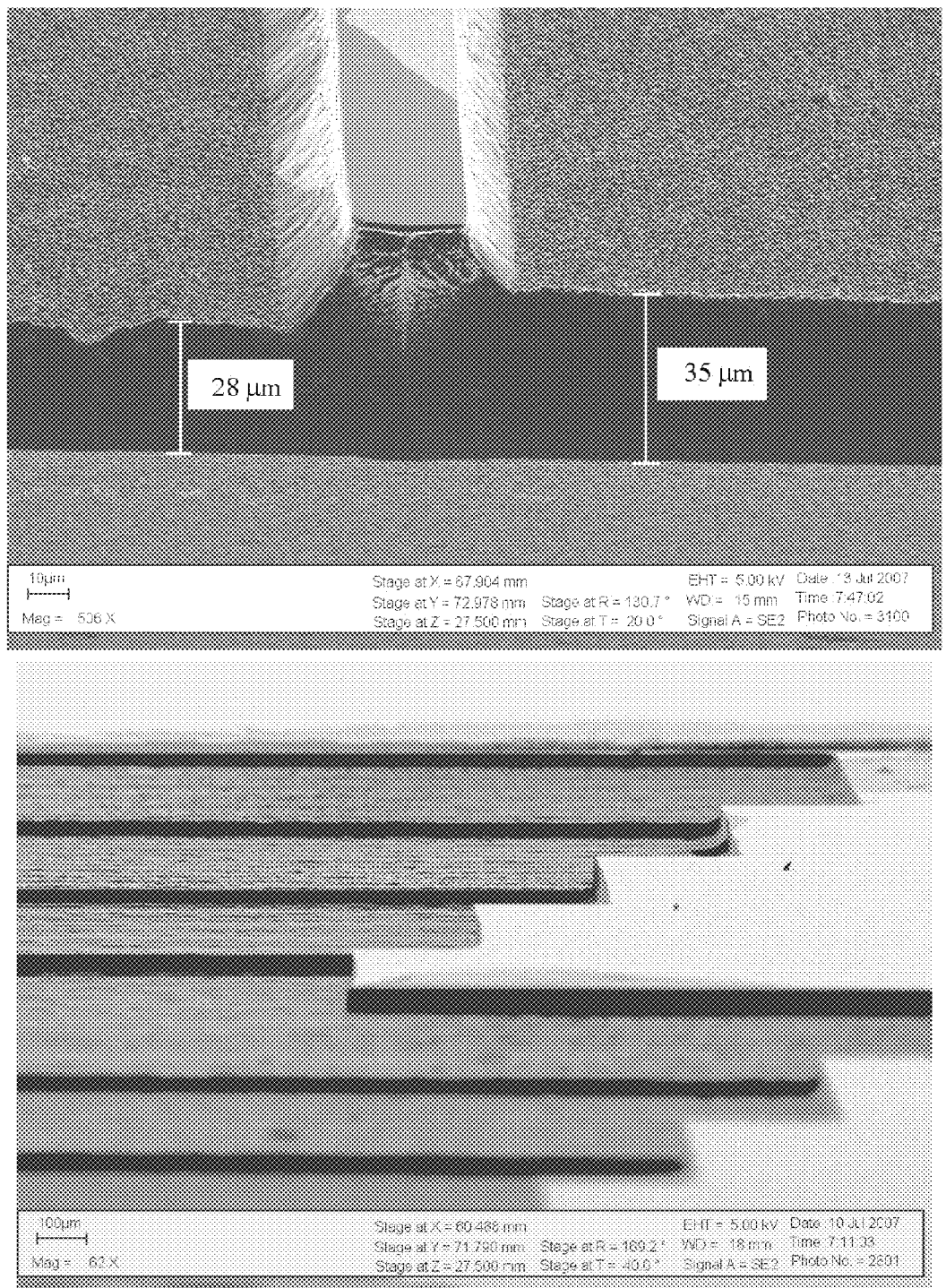
FIG. 12 shows SEM micrographs (bird-eye-view) of different step heights etched into silicon using RIE (top) and DRIE (bottom).

The patterns were transferred into the silicon via a selective etching process. The vertical dimensions of a 3D structure in silicon are determined by the given etch selectivity for a given process. RIE were used to etch 3-D silicon profiles with an etch selectivity of ~1:1.1. The resist to silicon etch selectivity for the DRIE process was ~1:60. The DRIE-etch was performed using an Oxford 100 fluorine etcher ("Bosch process"). A $CF_4/O_2$-plasma was used for RIE etching (AXIC Benchmark 800-II, etching conditions: 30 sccm $CF_4$, 5 sccm $O_2$, 100 mTorr, 75 W FW power, etch time 30 min). FIG. 12 show steps in silicon etched by RIE and DRIE respectively.

Figure 13:
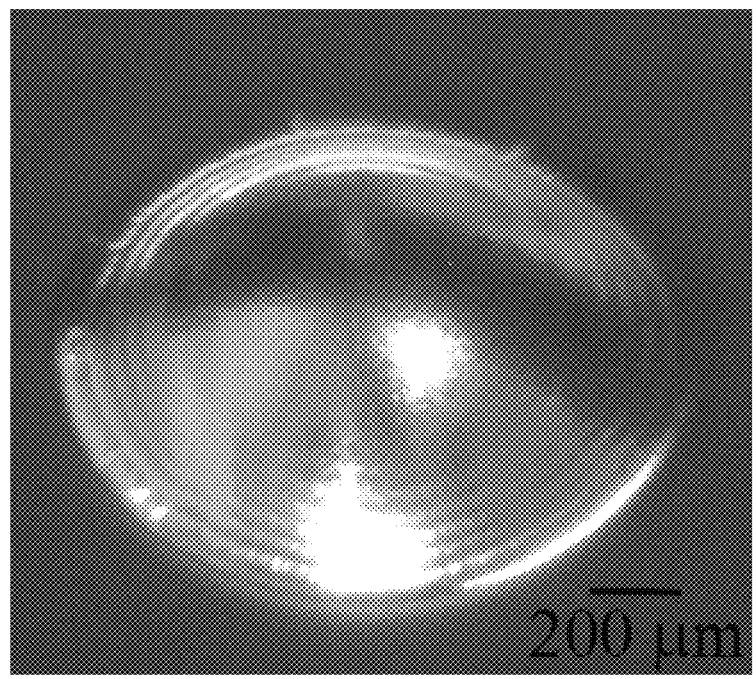
FIG. 13 shows a bird-eye-view, optical micrograph, DRIE-etched silicon micro-lens.
Figure 14:
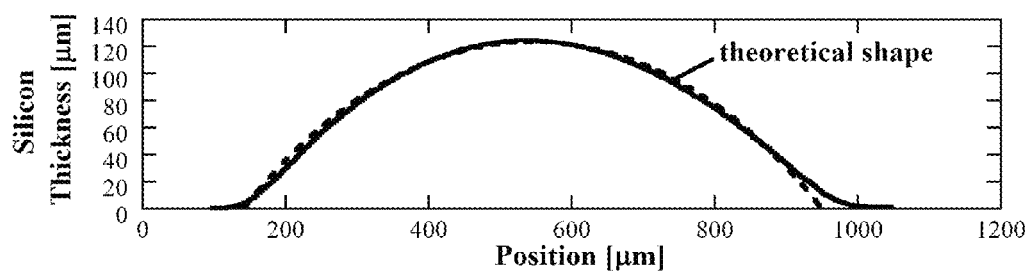
FIG. 14 shows a profilometer scan from a silicon micro-lens. The dashed curve indicates an ideal lens with a radius of 720 μm.
Figure 15:
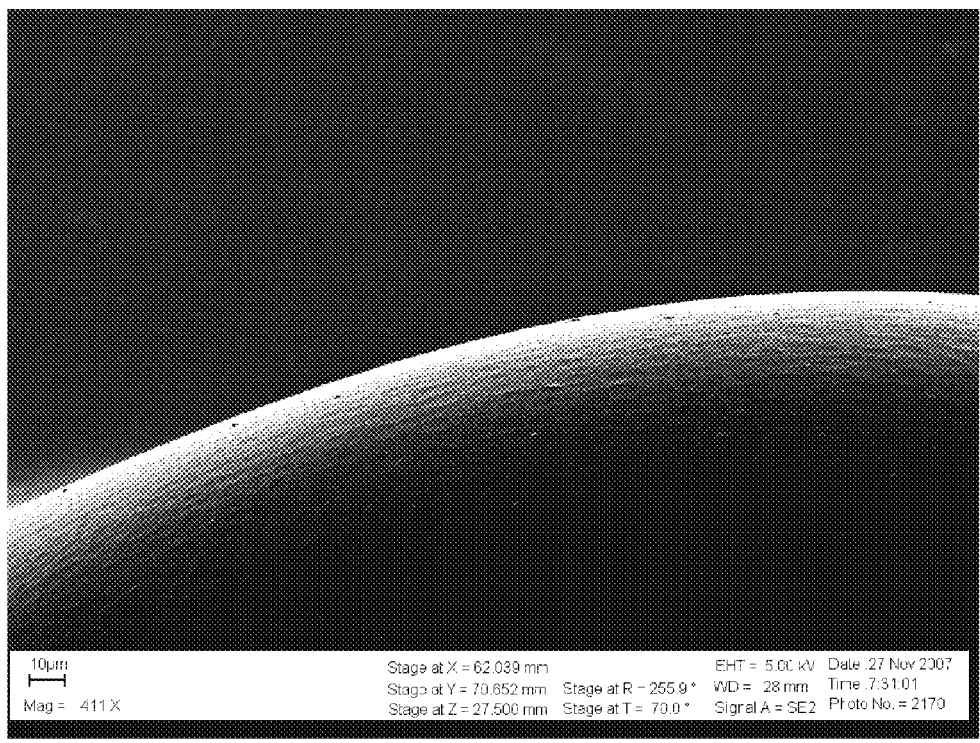
FIG. 15 shows an SEM micrograph (bird-eye-view) of a silicon micro-lens.

Micro-lenses are an example of the use of gray-tone lithography and DRIE etching (Henke et al., *Microelectronic Eng.*, 27, 267-270 (1995)). Micro-lens arrays are useful optical elements in the field of micro-displays, communications and data-storage systems. Silicon micro-lenses were first time-multiplexed plasma-etched (BOSCH process) using the gray-tone lithography method (Laerner et al., U.S. Pat. No. 5,501, 893 (1994)). (FIGS. 13-15). For optical components surface smoothness is an important parameter. The BOSCH process tends to form scalloping of the silicon due to the passivation cycle in this process. Improved etch recipes can reduce this effect. An Oxford 100 fluorine etcher was used in the BOSCH process mode following the recipe details given in (Quévy et al., *J. Micromech. Microeng.*, 12, 328 (2002)). The profilometer scan in FIG. 14 compares the ideal (circular lens with desired radius of 720 µm) and the final lens. The etched silicon profile varied slightly from the general shape of the resist. This was probably caused by the non-uniformity of the etching process (Rao et al., *Appl. Phys. Lett.*, 85, 6281 (2004)) but this demonstrates the capability of the method to produce complex 3-D topographies.

Figure 16:
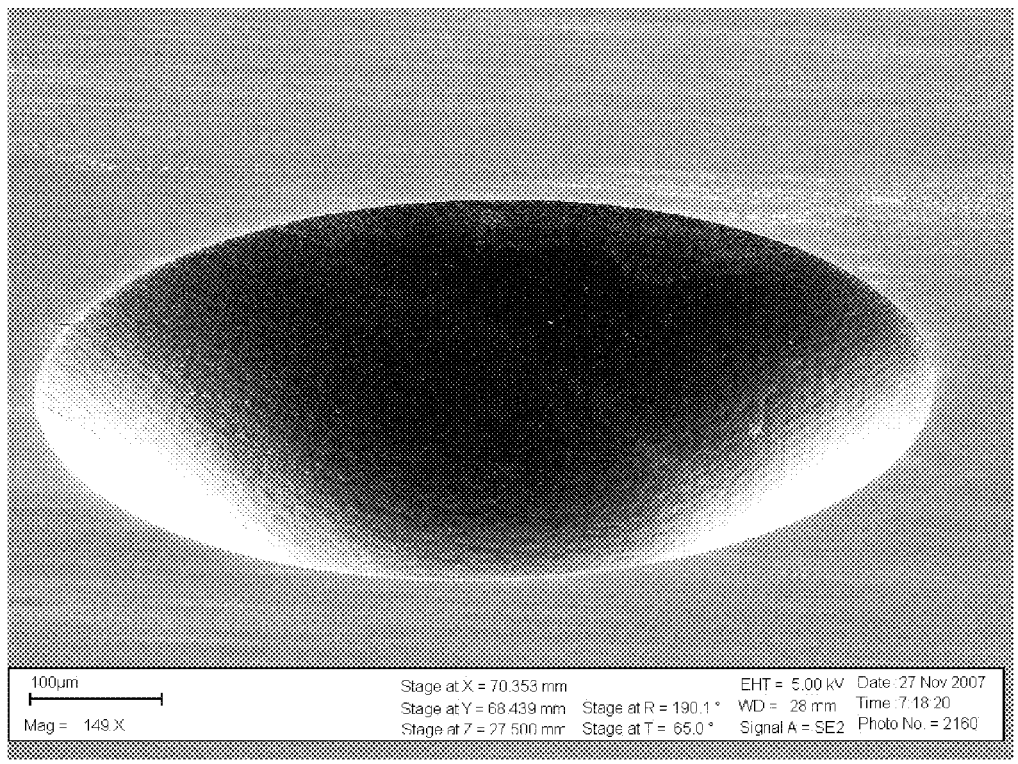
FIG. 16 shows a bird-eye-view, SEM micrograph of a silicon master for PDMS micro-lens.
Figure 17:
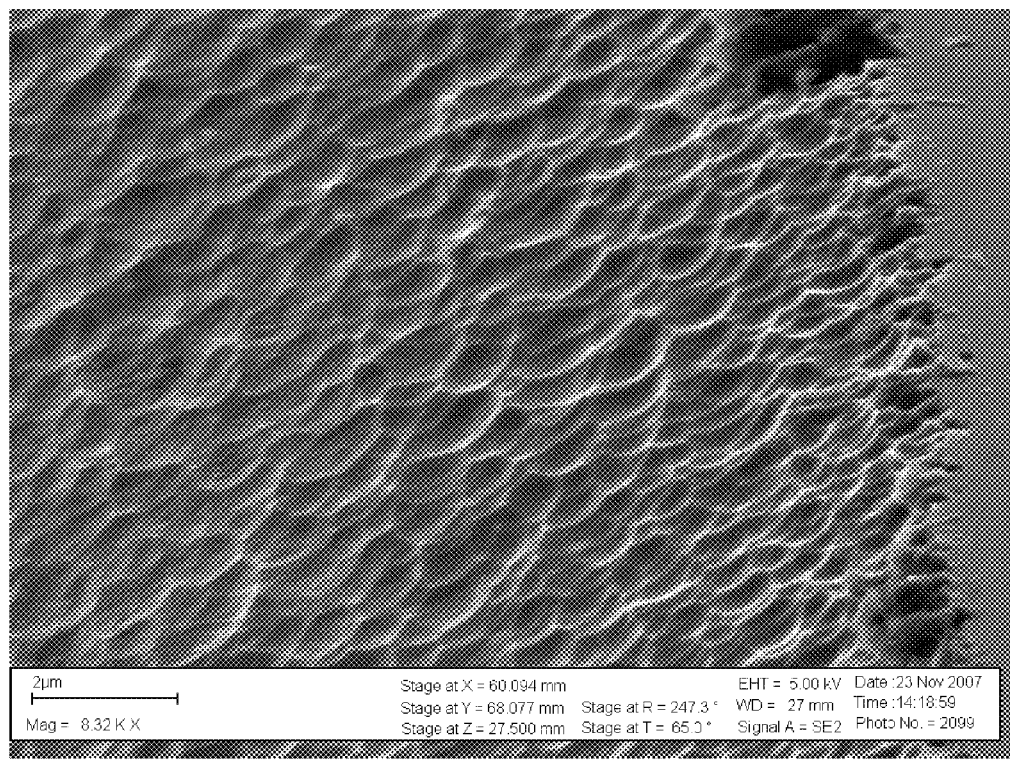
FIG. 17 shows a close-up of a bird-eye-view, SEM micrograph of a silicon master for PDMS molding.
Figure 18:
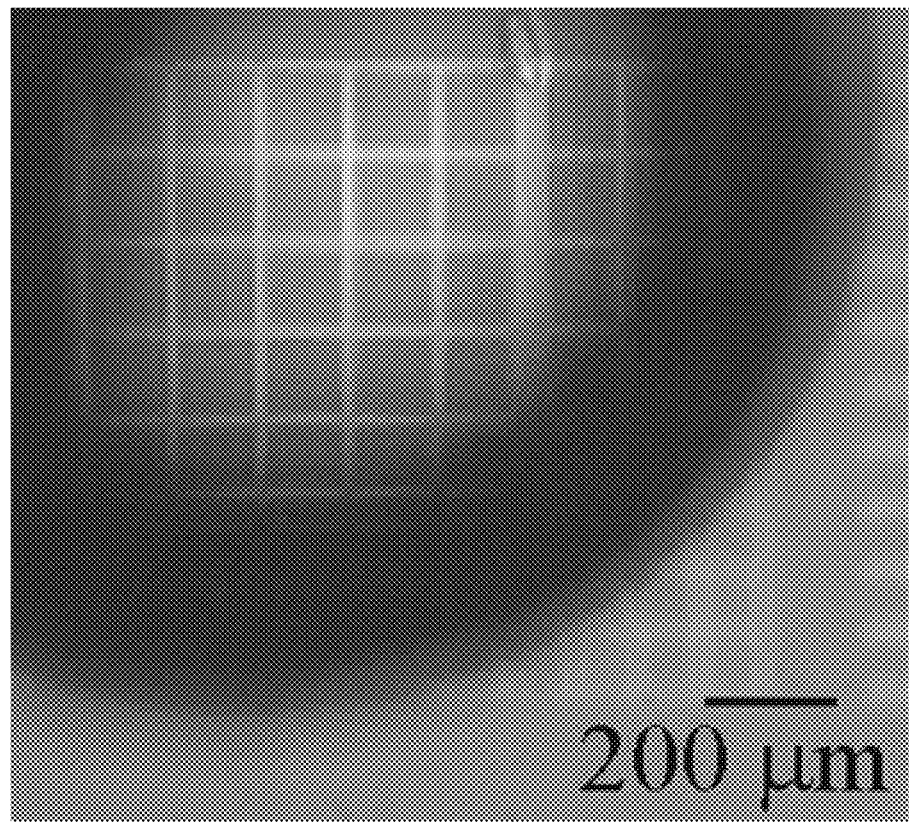
FIG. 18 shows a top-view, optical micrograph of a PDMS micro-lens placed on top of a Cr-photo-mask.
Figure 19:
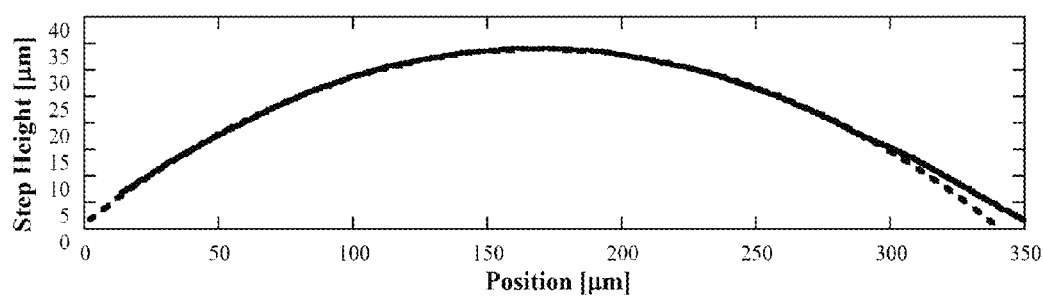
FIG. 19 shows a profilometer scan from a PDMS micro-lens. The dashed curve indicates the ideal lens shape.

Gray-tone lithography can also be used to generate 3-D structures by molding. PDMS (polydimethylsiloxane) is commonly used as an inverse mold. PDMS replicas were made using Sylgard 184 (Dow Corning). After curing at 65° C. for 1 h, the replica was peeled off carefully from the master. (65° C. is well below the glass temperature from a Novolac resist; the glass temperature is >130° C.) The DRIE-etched silicon master for a micro-lens is shown in FIGS. 15 and 16. The micro-lens was placed on top of a Cr-photo-mask (FIG. 18). FIG. 19 again compares the ideal lens shape with the final PDMS topography.

Figure 20:
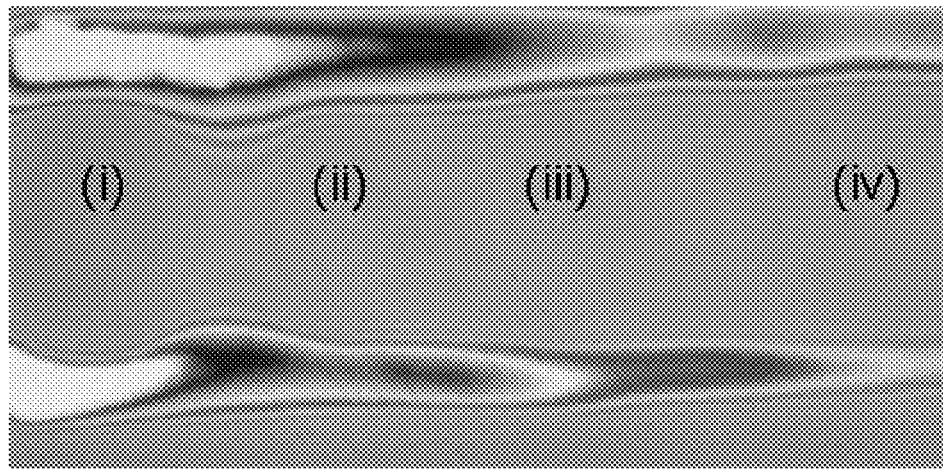
FIG. 20 shows a top view optical micrograph, gray-tone resist film made with an opal diffuser a) and with an "engineered diffuser" b). The different mask areas are marked for better comparison.
Figure 20:
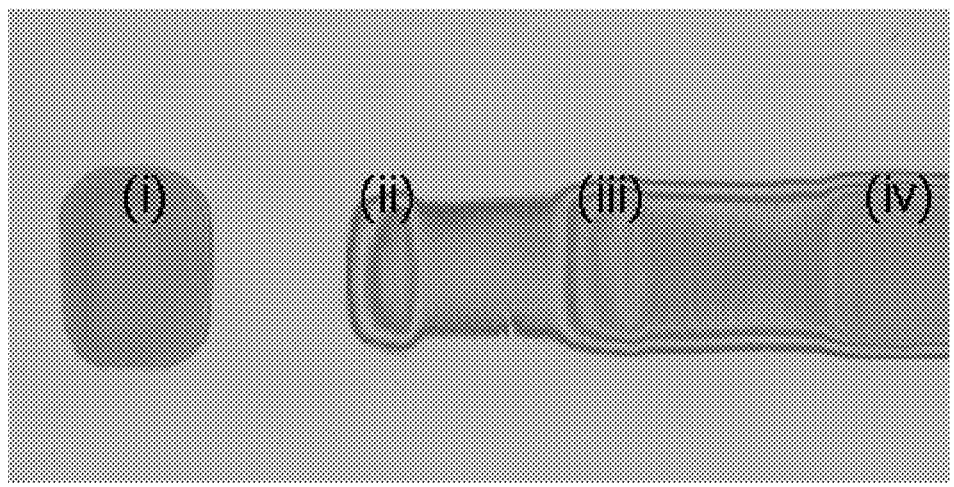

FIGS. 20a and b show gray-tone resist films which were made by an opal diffuser (FIG. 20a) and an "engineered diffuser" (FIG. 20b). The exact process conditions are given in Table 2. The model name of the used "engineered diffuser" is: EDC-60 (purchased from RC Photonics). This was a micro-lens based diffuser that diffuses light with a 30 degree angle in both directions measured from the direction of the collimated light (overall angle is 60 degrees). Because of this blurring over 30 degrees, the resist showed sharper features in comparison to the resist exposed with the opal diffuser. The degree of blurring can be adjusted by the choice of the diffuser. Furthermore, depending on the feature sizes on the used, the photomask may need to be adjusted. In case of the "engineered diffuser" some mask features (line arrays) were still visible in the developed mask.

TABLE 2

| | Dehydration |
|---|---|
| hotplate | >130° C., >10 min cool down to room temperature prior to resist spinning |
| | Photoresist |
| AZ P4330 | ~4 µm thick (target thickness) |
| spin | 4,000 rpm, 30 s (ACC 200 rpm/sec) |
| solvent evaporation | wait 120 s |
| soft bake | hotplate, 110° C., 90 s |
| exposure dose | 900 mJ/cm$^2$ (in hard-contact mode) |
| develop | AZ400K:DI water 1:4, 90 s in an ultra-sonic bath |

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. A method comprising:
   directing an exposing light through an optical diffuser to produce diffused light;
   directing the diffused light though a photomask having transparent areas corresponding to a gray-tone pattern to produce masked light;
   directing the masked light onto a photoresist material on a substrate;
   directing a second exposing light through a second mask to produce non-diffused masked light;
   directing the non-diffused masked light onto the photoresist material; and
   developing the photoresist to produce a three dimensional structure in the photoresist having sharp edges.

2. The method of claim 1, wherein the optical diffuser comprises an array of microlenses.

3. The method of claim 1, wherein there is a gap between the optical diffuser and the photomask.

4. The method of claim 1, wherein there is a gap between the photomask and the photoresist.

5. The method of claim 1, further comprising:
   processing the photoresist to reproduce a scaled version of the three dimensional structure on the substrate.

6. The method of claim 5, wherein the three dimensional structure on the substrate is part of a microelectromechanical system.

7. The method of claim 1, further comprising:
   forming a mold from the three dimensional structure in the photoresist.

8. The method of claim 1, further comprising:
   heating the three dimensional structure in the photoresist under conditions effective to cause smoothing of the resist profile.

9. The method of claim 1, further comprising:
   moving the mask parallel to and relative to the photoresist; and
   repeating the directing of the exposing light; the directing of the diffused light; and the directing of the masked light.

10. The method of claim 1, further comprising:
    directing the masked light through a lithography stepper before directing the masked light onto the photoresist material.

11. The method of claim 1, further comprising:
    defocusing the masked light before directing the masked light onto the photoresist material.

12. The method of claim 1, wherein the photomask is a high energy beam sensitive glass mask.

13. The method of claim 1, wherein the photomask is a laser patterned photomask.

14. The method of claim 1, wherein the optical diffuser is configured to produce a non-Lambertian and non-Gaussian distribution of diffused light.

15. The method of claim 1, wherein the optical diffuser is configured to produce a non-Lambertian distribution of diffused light.

16. The method of claim 1, wherein the optical diffuser is configured to produce a non-Gaussian distribution of diffused light.

* * * * *